(12) United States Patent
Dong et al.

(10) Patent No.: US 9,508,879 B2
(45) Date of Patent: Nov. 29, 2016

(54) DETECTOR DEVICE

(71) Applicant: Alcatel-Lucent USA Inc., Murray Hill, NJ (US)

(72) Inventors: Po Dong, Morganville, NJ (US); Young-Kai Chen, Berkeley Heights, NJ (US)

(73) Assignee: Alcatel Lucent, Boulogne-Billancourt (FR)

( * ) Notice: Subject to any disclaimer, the term of this patent is extended or adjusted under 35 U.S.C. 154(b) by 132 days.

(21) Appl. No.: 14/060,827

(22) Filed: Oct. 23, 2013

(65) Prior Publication Data

US 2015/0108336 A1 Apr. 23, 2015

(51) Int. Cl.
*H01J 40/14* (2006.01)
*H01L 31/0232* (2014.01)
*G02B 6/12* (2006.01)
*G01J 1/04* (2006.01)
*G02B 6/42* (2006.01)

(52) U.S. Cl.
CPC .......... *H01L 31/0232* (2013.01); *G01J 1/0425* (2013.01); *G02B 6/12* (2013.01); *G02B 6/4206* (2013.01)

(58) Field of Classification Search
CPC ..................... H01L 31/0232; H01L 31/02327; G02B 6/12
USPC ................ 250/208.1, 214.1, 227.11, 227.28; 385/14, 70, 73
See application file for complete search history.

(56) References Cited

U.S. PATENT DOCUMENTS

| 6,298,178 | B1 | 10/2001 | Day et al. |
| 2002/0167722 | A1* | 11/2002 | Willner ................ H01S 3/0675 359/349 |
| 2003/0202750 | A1 | 10/2003 | Okada et al. |
| 2009/0129427 | A1 | 5/2009 | Ariga et al. |

FOREIGN PATENT DOCUMENTS

| EP | 0905536 A2 | 3/1999 |
| JP | S63173239 A | 7/1988 |

OTHER PUBLICATIONS

International Search Report and Written Opinion of the International Searching Authority for International Application No. PCT/US2014/061309 dated Apr. 1, 2015.
International Preliminary Report on Patentability for International application No. PCT/US2014/061309 dated May 6, 2016.

* cited by examiner

*Primary Examiner* — Kevin Pyo
(74) *Attorney, Agent, or Firm* — Carlson, Gaskey & Olds, P.C.

(57) ABSTRACT

An apparatus according to an exemplary aspect of the present disclosure includes, among other things, a substrate, at least one semiconductor light-detector on the substrate and an optical waveguide on the substrate. The optical waveguide is configured to guide light to the at least one light-detector, one or more vias in a surface of the substrate or one or more ridges on the surface of the substrate. The one or more vias or ridges are configured to at least partially interrupt light propagating along the surface toward the at least one semiconductor light-detector from outside the optical waveguide.

22 Claims, 2 Drawing Sheets

DETECTOR DEVICE

BACKGROUND

This section introduces aspects that may be helpful to facilitating a better understanding of the inventions. Accordingly, the statements of this section are to be read in this light and are not to be understood as admissions about what is in the prior art or what is not in the prior art.

Power monitors or light detectors are useful for a variety of situations. For example, many optic components include on-chip power monitors that monitor input optical power. One such component includes a coherent receiver. Two optical signals are typically required for a coherent receiver to operate. One of those optical signals may be referred to as the data-carrier signal and the other may be referred to as the local oscillator signal. The power of the local oscillator signal typically may be significantly higher than that of the data-carrier signal.

SUMMARY

An apparatus according to an exemplary aspect of the present disclosure includes, among other things, a substrate, at least one semiconductor light-detector on the substrate and an optical waveguide on the substrate. The optical waveguide is configured to guide light to the at least one light-detector, one or more vias in a surface of the substrate or one or more ridges on the surface of the substrate are configured to at least partially interrupt light propagating along the surface toward the at least one semiconductor light-detector from outside the optical waveguide.

In a further non-limiting embodiment of the apparatus of the foregoing paragraph, a light-absorptive or light-reflective material on the surface of substrate in a vicinity of the detector is configured to one of absorb or reflect at least some light propagating along the surface toward the at least one semiconductor light-detector from outside the optical waveguide.

In a further non-limiting embodiment of the apparatus of either of the foregoing paragraphs, the one or more vias in a surface of the substrate or one or more ridges on the surface of the substrate includes a plurality of vias or a plurality of ridges and the one or more vias or ridges form a Bragg reflector for light in one or more of the optical telecommunications S, C, and/or L bands.

In a further non-limiting embodiment of the apparatus of any of the foregoing paragraphs, the one or more vias in a surface of the substrate or one or more ridges includes a plurality of vias forming a Bragg reflector for light in one or more of the optical telecommunications S, C, and L bands.

In a further non-limiting embodiment of the apparatus of any of the foregoing paragraphs, segments of the one or more vias or ridges located adjacent to the optical waveguide are oriented transverse to the adjacent segment of the optical waveguide.

In a further non-limiting embodiment of the apparatus of any of the foregoing paragraphs, the one or more vias or ridges includes a plurality of ridges forming a Bragg reflector for light in one or more of the optical telecommunications S, C, and L bands.

In a further non-limiting embodiment of the apparatus of any of the foregoing paragraphs, the segments of the one or more vias or ridges are oriented oblique to an adjacent segment of the optical waveguide.

In a further non-limiting embodiment of the apparatus of any of the foregoing paragraphs, the light-detector is situated at least partially on the surface of the substrate.

In a further non-limiting embodiment of the apparatus of any of the foregoing paragraphs, the one or more vias or ridges substantially surround the light-detector.

In a further non-limiting embodiment of the apparatus of any of the foregoing paragraphs, the one or more vias or ridges includes a plurality of the vias or a plurality of the ridges.

A method of operating an apparatus according to another exemplary aspect of the present disclosure includes, among other things, a substrate, at least one semiconductor light-detector on the substrate, an optical waveguide on the substrate and one or more vias in a surface of the substrate or one or more ridges on the surface of the substrate. Light is guided to the at least one detector using the optical waveguide. Light propagating along the surface toward the at least one semiconductor light-detector from outside the optical waveguide is at least partially interrupted using the one or more vias or ridges for the interrupting.

In a further non-limiting embodiment of the method of the previous paragraph, the apparatus includes a light-absorptive or light-reflective material on the surface of substrate in a vicinity of the at least one semiconductor light-detector, and the method comprises using the light-absorptive material to one of absorb or reflect at least some of light propagating along the surface toward the at least one semiconductor light-detector from outside the optical waveguide.

In a further non-limiting embodiment of the method of either of the foregoing paragraphs, the one or more vias in a surface of the substrate or the one or more ridges on the surface of the substrate includes a plurality of vias or a plurality of ridges and the one or more vias or ridges form a Bragg reflector for light in one or more of the optical telecommunications S, C, and/or L bands.

In a further non-limiting embodiment of the method of any of the preceding paragraphs, the one or more vias in a surface of the substrate or the one or more ridges includes a plurality of vias forming a Bragg reflector for light in one or more of the optical telecommunications S, C, and L bands.

In a further non-limiting embodiment of the method of any of the preceding paragraphs, segments of the one or more vias or ridges located adjacent to the optical waveguide are oriented transverse to the adjacent segment of the optical waveguide.

In a further non-limiting embodiment of the method of any of the preceding paragraphs, the one or more vias or ridges includes a plurality of ridges forming a Bragg reflector for light in one or more of the optical telecommunications S, C, and L bands.

In a further non-limiting embodiment of the method of any of the preceding paragraphs, segments of the one or more vias or ridges are oriented oblique to an adjacent segment of the optical waveguide.

In a further non-limiting embodiment of the method of any of the preceding paragraphs, the light-detector is situated at least partially on the surface of the substrate.

In a further non-limiting embodiment of the method of any of the preceding paragraphs, the one or more vias or ridges substantially surround the light-detector.

In a further non-limiting embodiment of the method of any of the preceding paragraphs, the one or more vias or ridges includes a plurality of the vias or a plurality of the ridges.

The various features and advantages of at least one disclosed example embodiment will become apparent to

DETAILED DESCRIPTION OF SOME ILLUSTRATIVE EMBODIMENTS

Figure 1:
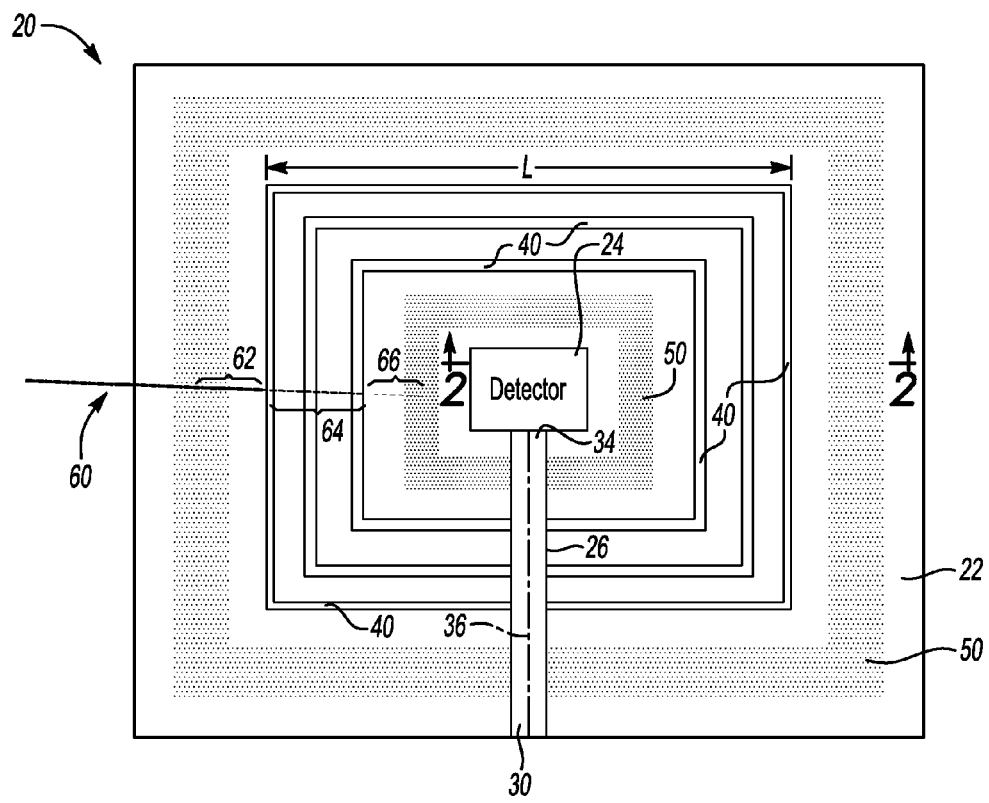
FIG. 1 schematically illustrates an example embodiment of a light detector.

FIG. 1 schematically illustrates selected portions of a light detector 20. In some embodiments the light detector device 20 is a portion of an optic component, such as a photonic integrated circuit. The light detector 20 in such embodiments may be useful, for example, to monitor the power of an input signal.

The term "light" is used in this description to refer to electromagnetic radiation at visible or infrared wavelengths. For example, light may have a wavelength in the optical telecommunications C, L and/or S bands.

The light detector 20 includes a substrate 22, which comprises silicon in the illustrated example. Other embodiments include different substrate materials. At least one light detector 24 is supported on the substrate 22. The light detector 24 may be one of a variety of known light detectors capable of sensing visible, ultraviolet, and/or infrared light (e.g., a diode or a transistor). The light detector 24 provides an indication of light incident on the light detector 24. For example, the light detector 24 may provide an indication of a power of light incident on the detector 24.

A channel 26 on the substrate 22 is an optical waveguide configured to index-guide light toward the light detector 24. The channel 26 includes an inlet 30 to the channel 26 and an outlet 34 near the light detector 24. The channel 26 guides light to propagate along its longitudinal axis 36.

While the channel 26 may guide light to propagate toward the light detector 24, other light, such as scattered light, may approach the light detector 24 along at least one other trajectory, which may be parallel or transverse to the guiding direction of the channel 26. For example, in a photonic integrated circuit embodiment that includes a local oscillator input signal of higher power, the local oscillator can generate a significant amount of scattered light. While the channel 26 will guide a light signal along the channel 26 for detection by the light detector 24, other light, such as scattered light from the local oscillator, may be present in the vicinity of the light detector 24.

Figure 2:
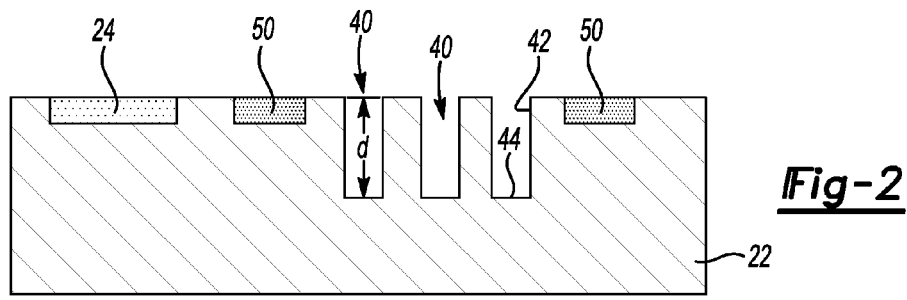
FIG. 2 is a cross-sectional illustration taken along the lines 2-2 in FIG. 1 showing an example via profile.

As can be appreciated from FIGS. 1 and 2, the device 20 includes at least one surface variation along at least one plane along which light may approach the detector 24. In this example, the surface variation comprises at least one via 40 in the substrate. The illustrated example includes a plurality of vias 40. The one or more vias 40, laterally surround the region on the substrate 22 that includes the light detector 24. The one or more vias 40 are situated to reduce the amount or intensity of scattered light or stray light that reaches the light detector 24. The vias 40 are located to at least partially interrupt light rays that approach the light detector 24 along the surface of the substrate 22 from outside the channel 26. The one or more vias 40 deflect or reflect light, which propagates along the interfaces between the vias 40 and the substrate 22. The deflection or reflection of such light occurs because of the index difference between the substrate material (e.g., silicon) and air, vacuum or any other optically transparent optical material in the one or more vias 40.

Adjacent to the channel 26, the one or more of the vias 40 are aligned, at least, partially transverse to the direction of the channel 26. That is, adjacent to the channel 26, the direction of the vias 40 have a length 1 that is, at least, partially transverse to the axis 36 of the channel 26. For example, adjacent portions of the vias may be perpendicular to the channel 26. A depth d of each via in the illustrated example is generally perpendicular to the axis 36 of the channel 26. Typically, the one or more vias 40 are situated on the substrate 22 to not substantially interfere with light in the channel 26. For example, the one or more vias 40 typically do not cross the channel 26 and may be separated from the channel 26 by a gap Such a gap may be large enough, for example, so that light guided by the channel 26 is not significantly reflected or scattered by the one or more vias 26.

The one or more vias 40 shown in FIG. 2 have, for example, an approximately rectangular cross-sectional profile. In such embodiments, each via includes sidewalls 42 and an end wall 44. The distance from the outer edge of the vias 40 (i.e., the surface of the substrate 22) to the end wall 44 corresponds to a depth d in this example. In other embodiments, the cross-sectional shapes of the one or more vias 40 may be, for example, curved, hemi-circular, trapezoidal, etc.

Figure 3:
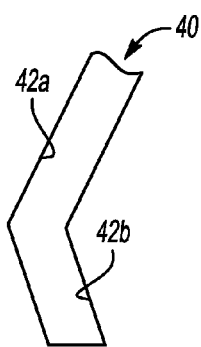
FIG. 3 is a cross-sectional illustration of another example via profile.

FIG. 3 shows an example of a non-simply connected cross-sectional profile for the vias 40. For this profile, the sidewall 42 has one or more segments 42a and 42b that are aligned at oblique angles relative to the propagation direction in the channel 26. Such obliquely oriented sidewall(s) 42 may deflect or reflect light within the vias 40 or otherwise away from the light detector 24.

Figure 4:
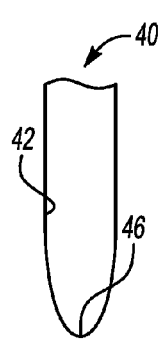
FIG. 4 is a cross-sectional illustration of another example via profile.

FIG. 4 shows an example embodiment of a cross-sectional profile for the vias 40 that is at least partially rounded.

If at least one of the one or more vias 40 or some combination of them approximately laterally surrounds the light detector 24 on the substrate, the one or more vias 40 will reflect a portion of stray or scattered light that approaches the light detector 24 from about any direction away from the detector 24. In the illustrated embodiment, at least one via segment is positioned on each side of the light detector 24.

Including a series of vias 40 along one or more sides of the light detector 24, as illustrated, may increase the attenuation of stray or scattered light, which is initially propagating towards the light detector 24. If the reflecting surfaces of the vias 40 of such a series are spaced apart by an odd number times one-fourth of the effective wavelength of the light thereat, the reflections of the light by different ones of the vias 40 may constructively add to further attenuating the intensity of such stray or scattered light at the light detector 24. For use in telecommunications apparatus, such as optical receivers, the effective wavelength may be a wavelength in the optical telecommunications C-band and/or L-band.

While the illustrated vias 40 include linear segments that form a rectangular or polygonal pattern laterally around the light detector 24 other geometries or shapes may be used in other embodiments.

Some embodiments may include a combination of the vias 40. In such a combination, some of the different vias 40 may have different cross-sectional profiles. In such a combination, different ones of the vias 40 may form different lateral patterns around the light detector 24, e.g., a circle and a square.

The one or more vias 40 may be formed in the substrate 22 using a conventional technique, such as mask-controlled wet and/or dry etch(es). Based on this description, those of ordinary skill in the relevant arts will be able to make appropriate vias without undue experimentation.

The one or more vias 40 reduce the amount of scattered or stray light incident on the light detector 24, which can enhance the ability of the light detector 24 to provide an accurate indication of the light that is intentionally directed along the optical waveguide 26. Reducing or eliminating stray detected light can reduce the amount of systematic and/or random noise in the output measurement signals of the light detector 24. The device 20 may be, therefore, more sensitive to the light of interest compared to an arrangement without any vias similar to the one or more vias 40.

The illustrated device 20 may include a light-absorptive and/or light reflective material 50 on at least one region of the substrate 22 in the vicinity of the light detector 24. In the illustrated example, the absorptive material 50 is situated on both sides of the vias 40 in a manner that generally surrounds the light detector 24. In some examples, absorptive material 50 is provided inside the vias 40. The absorptive material 50 may be configured to absorb light that is moving along a plane in which the light detector 24 is situated. For example, a light-reflective material 50 may have a bandgap that is small enough to or configured to enable excitation of charge carriers by light at wavelengths of the scattered and/or stray light and partially convert energy of such light into other excitations, e.g., phonons. Example light-absorptive and/or light-reflective materials may include doped silicon, germanium, metals or a combination of two or more of these examples. One feature of a metal is that it may be located to and have a surface oriented to reflect stray or scattered light away from the light detector 24, thus, functioning as a light reflective material.

The combination of the vias 40 and the light-absorptive and/or light-reflective material 50 may increase the signal-to-noise ratio in electrical measurement signals from the light detector 24. Thus, in photonic integrated circuit embodiments, the light detector 24 may have an effective higher sensitivity to the power of the measured light signal because the one or more vias 40 and/or the light-absorptive and/or light-reflective material 50 reduces the amount of stray or scattered light incident on the light detector 24, e.g., light that would otherwise be incident thereon from a higher power, local light oscillator in a coherent optical receiver.

FIG. 1 schematically shows stray light at 60 approaching the light detector 24 from outside of the optical waveguide 26. The thickness of the broken line representing the stray light 60 schematically indicates an intensity of the stray light. Toward the left of the illustration, there is shown a first intensity of the stray light directed along a trajectory toward the light detector 24 shown at 62. After the light 60 passes a first portion of the light-absorptive and/or light-reflective material 50, the intensity of such light is less as shown at 64 because the light-absorptive and/or light-reflective material 50 absorbed or reflected some of said light.

The one or more vias 40 on the left side of the light detector 24 (according to the drawing) may also cause at least some of such stray light 60 to be partially deflected or reflected, which may results in a further reduction in the intensity of such light 60, which continues to approach the light detector 24. For example, the one or more vias 40 may be relatively spaced along the surface of the substrate to form a Bragg reflector for wavelengths of light near the wavelength of such stray or scattered light. As an example, the spacing between adjacent ones of the vias 40 may be approximately (N+1/2) lambda, where lambda is the effective wavelength of the stray light when propagating along or along and over the surface of the substrate (e.g., equal to the wavelength of such light plus or minus 10 percent or plus or minus 20 percent). Here, the effective wavelength may be a wavelength of light in the C, L or S optical telecommunications bands and/or may be the effective wavelength of light emitted by a local optical oscillator of a coherent optical receiver, wherein the coherent optical receiver includes the light detector 40. The thinner broken line of light at 66 indicates the effect the one or more vias 40 may have on the intensity of light still following a trajectory toward the light detector 24.

In this example, another region of light-absorptive and/or light-reflective material 50 may be positioned between the vias 40 and the light detector 24. Then, the stray or scattered light at 66 may be further reduced in intensity as it is absorbed or reflected by the material 50. In this example, essentially all of the light 60 may be prevented from reaching the light detector 24. The combined effects of the light-absorptive and/or light-reflective material 50 and the one or more vias 40 (e.g., arranged as an optical Bragg reflector), may eliminate or substantially reduce a source of light noise at the light detector 24 thereby enhancing the ability of the light detector 24 to provide an accurate indication of the intensity of light incident on the light detector 24 from the optical waveguide 26.

Figure 5:
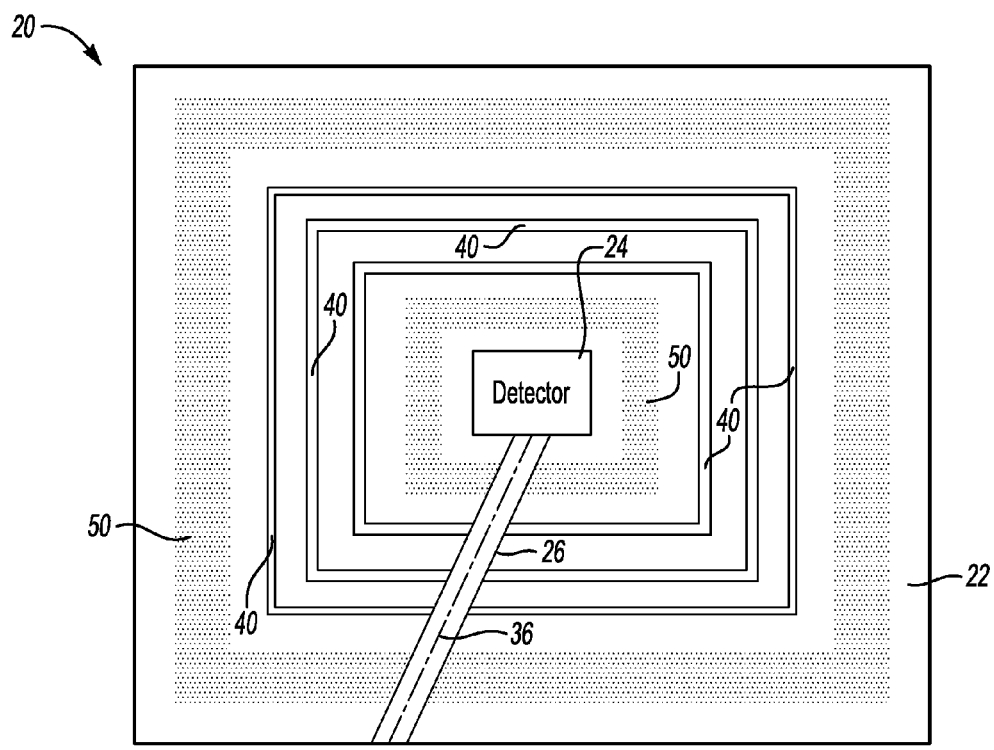
FIG. 5 schematically illustrates another example light detector configuration.

FIG. 5 illustrates another example embodiment in which the optical waveguide 26 is oriented at an oblique angle relative to the length of the sections of the one or more vias 40 that are situated on the substrate 22 in an area traversed by the optical waveguide 26. The depth of the one or more vias 40 in this example may be about perpendicular to the axis 36 of the optical waveguide for some configurations of the cross-sectional profile of the vias 40 and not perpendicular thereto for other configurations. This example orientation of the optical waveguide 26 relative to the one or more vias 40 at an oblique angle may further increase the light detector's sensitivity by further reducing the intensity of stray or scattered light that reaches the light detector 24, when said stray or scattered light approaches from a direction corresponding to a direction along the optical waveguide 26, such as from the bottom in FIG. 1. Other arrangements of the optical waveguide 26 are possible that include at least some of the channel length positioned to establish a barrier or obstruction that a substantial portion of the stray or scattered light must cross on its way toward the light detector 24. At least some of the length of the optical waveguide 26 may be situated transverse to a direction that a large portion of such stray or scattered light from outside the channel 26 follows toward the light detector 24. For example, the optical waveguide 24 may have a segment that is located transverse to a line between the light detector 24 and a local optical oscillator located on the optical chip of a coherent optical receiver (i.e., to intercept and attenuate scattered or stray light therefrom).

While each of the illustrated optical waveguides 26 may be straight, other embodiments may include an optical waveguide 26 that includes one or more bends or angles along the length of the channel 26. For example, the optical waveguide 26 may have a curved, serpentine or zig-zag configuration.

Figure 6:
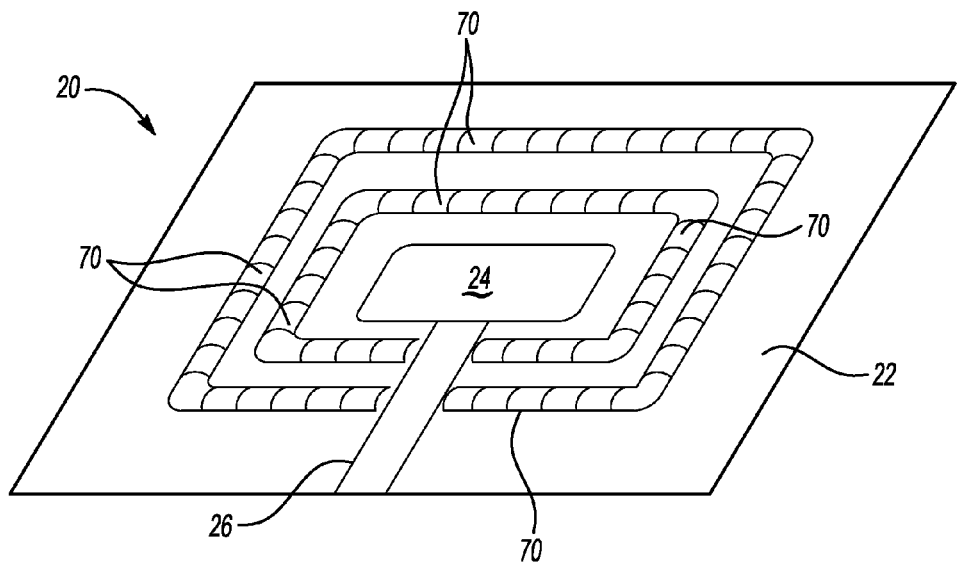
FIG. 6 schematically illustrates another example light detector configuration.

While the devices 20 of FIGS. 1 and 5 include arrays of one or more vias 40 in the surface of the substrate 22, other embodiments may include surface variations such as ridges 70 on the surface of the substrate 22 as schematically shown in FIG. 6. In some examples, the ridges 70 include absorptive material 50 on at least a portion of the ridges. The ridges 70 may be arranged in a variety of patterns to reduce or eliminate scattered light reaching the detector 24.

For example, some embodiments may include a pattern of such ridges 70 with about the same relative arrangement as the via(s) 40 of FIGS. 1 and 5 (e.g., relative to the light detector 24 and the optical waveguide 26). As an example, such ridges 70 may be arranged to approximately form a Bragg reflector along the surface of the substrate 22. Such a ridge-based Bragg reflector may be configured to substantially reflect light normally incident thereon at optical telecommunications wavelengths (e.g., wavelengths of the optical telecommunications C, S, and/or L bands). For example the spacing between adjacent ones of such ridges 70 may be equal to (N+1/2) lambda, where lambda is an effective wavelength of light in the C, L, and/or S telecommunications bands when propagating along or adjacent to the surface of the substrate and N is any integer. For example, the spacing of ridges may be approximately 1/2, 3/2, 5/2, or 7/2, e.g., plus or minus 10 percent or 20 percent, times an effective wavelength of light of a local optical oscillator or a coherent optical receiver, e.g., a local optical oscillator on the substrate 22.

While various features and aspects are described above in connection with one or more particular embodiments, those features and aspects are not necessarily exclusive to the corresponding embodiment. The disclosed features and aspects may be combined in other ways than those specifically mentioned above. In other words, any feature of one embodiment may be included with another embodiment or substituted for a feature of another embodiment.

The preceding description is illustrative rather than limiting in nature. Variations and modifications to at least one disclosed example may become apparent to those skilled in the art that do not necessarily depart from the essence of the contribution to the art provided by the disclosed example. The scope of legal protection can only be determined by studying the following claims.

We claim:

1. An apparatus, comprising:
   a substrate;
   at least one semiconductor light-detector on the substrate;
   an optical waveguide on the substrate, the optical waveguide being configured to guide light to the at least one light-detector; and
   one or more vias in a surface of the substrate or one or more ridges on the surface of the substrate, the one or more vias or ridges laterally surrounding the at least one semiconductor light-detector, the one or more vias or ridges being configured to at least partially interrupt light propagating along said surface toward the at least one semiconductor light-detector from outside the optical waveguide.

2. The apparatus of claim 1, comprising
   a light-absorptive or light-reflective material on the surface of substrate in a vicinity of the detector, the light-absorptive material being configured to one of absorb or reflect at least some of light propagating along said surface toward the at least one semiconductor light-detector from outside the optical waveguide.

3. The apparatus of claim 1, wherein
   the one or more vias in a surface of the substrate or one or more ridges on the surface of the substrate includes a plurality of vias or a plurality of ridges, and
   the one or more vias or ridges form a Bragg reflector for light in one or more of the optical telecommunications S, C, and/or L bands.

4. The apparatus of claim 1, wherein the one or more vias in a surface of the substrate or one or more ridges includes a plurality of vias forming a Bragg reflector for light in one or more of the optical telecommunications S, C, and L bands.

5. The apparatus of claim 1, wherein
   segments of the one or more vias or ridges located adjacent to the optical waveguide are oriented transverse to the adjacent segment of the optical waveguide.

6. The apparatus of claim 1, wherein the one or more vias or ridges includes a plurality of ridges forming a Bragg reflector for light in one or more of the optical telecommunications S, C, and L bands.

7. The apparatus of claim 5, wherein the segments of the one or more vias or ridges are oriented oblique to an adjacent segment of the optical waveguide.

8. The apparatus of claim 1, wherein
   the light-detector is situated at least partially on the surface of the substrate.

9. The apparatus of claim 1, wherein the one or more vias or ridges substantially surround the light-detector.

10. The apparatus of claim 1, wherein the one or more vias or ridges includes a plurality of the vias or a plurality of the ridges.

11. A method of operating an apparatus including
    a substrate;
    at least one semiconductor light-detector on the substrate;
    an optical waveguide on the substrate; and
    one or more vias in a surface of the substrate or one or more ridges on the surface of the substrate, the one or more vias or ridges laterally surrounding the at least one semiconductor light-detector, the method comprising the steps of:
    guiding light to the at least one detector using the optical waveguide; and
    at least partially interrupting light propagating along said surface toward the at least one semiconductor light-detector from outside the optical waveguide, using the one or more vias or ridges for the interrupting.

12. The method of claim 11, wherein the apparatus includes
    a light-absorptive or light-reflective material on the surface of substrate in a vicinity of the at least one semiconductor light-detector, and the method comprises using the light-absorptive material to one of absorb or reflect at least some of light propagating along said surface toward the at least one semiconductor light-detector from outside the optical waveguide.

13. The method of claim 11, wherein
    the one or more vias in a surface of the substrate or the one or more ridges on the surface of the substrate includes a plurality of vias or a plurality of ridges, and
    the one or more vias or ridges form a Bragg reflector for light in one or more of the optical telecommunications S, C, and/or L bands.

14. The method of claim 11, wherein the one or more vias in a surface of the substrate or the one or more ridges includes a plurality of vias forming a Bragg reflector for light in one or more of the optical telecommunications S, C, and L bands.

15. The method of claim 11, wherein
segments of the one or more vias or ridges located adjacent to the optical waveguide are oriented transverse to the adjacent segment of the optical waveguide.

16. The method of claim 11, wherein the one or more vias or ridges includes a plurality of ridges forming a Bragg reflector for light in one or more of the optical telecommunications S, C, and L bands.

17. The method of claim 11, wherein segments of the one or more vias or ridges are oriented oblique to an adjacent segment of the optical waveguide.

18. The method of claim 11, wherein
the light-detector is situated at least partially on the surface of the substrate.

19. The method of claim 11, wherein the one or more vias or ridges substantially surround the light-detector.

20. The method of claim 11, wherein the one or more vias or ridges includes a plurality of the vias or a plurality of the ridges.

21. The method of claim 11, wherein
the optical waveguide occupies a portion of the substrate; and
the one or more vias or ridges occupies another portion of the substrate such that the one or more vias or ridges are separate from the optical waveguide.

22. The apparatus of claim 1, wherein
the optical waveguide occupies a portion of the substrate; and
the one or more vias or ridges occupies another portion of the substrate such that the one or more vias or ridges are separate from the optical waveguide.

* * * * *